(12) United States Patent
Loecklin

(10) Patent No.: US 11,644,346 B2
(45) Date of Patent: May 9, 2023

(54) ROTATION ANGLE ENCODER APPARATUS

(71) Applicant: VIAVI SOLUTIONS INC., San Jose, CA (US)

(72) Inventor: Eberhard Lothar Loecklin, Reutlingen (DE)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

(21) Appl. No.: 17/401,113

(22) Filed: Aug. 12, 2021

(65) Prior Publication Data

US 2021/0372827 A1 Dec. 2, 2021

Related U.S. Application Data

(63) Continuation of application No. 16/243,862, filed on Jan. 9, 2019, now Pat. No. 11,118,944.

(51) Int. Cl.
| | | |
|---|---|---|
| *G01D 5/34* | (2006.01) | |
| *G01D 5/347* | (2006.01) | |
| *H01L 31/028* | (2006.01) | |
| *H01L 31/0304* | (2006.01) | |
| *H01L 31/167* | (2006.01) | |

(52) U.S. Cl.
CPC ....... *G01D 5/34792* (2013.01); *G01D 5/3473* (2013.01); *H01L 31/028* (2013.01); *H01L 31/0304* (2013.01); *H01L 31/03046* (2013.01); *H01L 31/167* (2013.01)

(58) Field of Classification Search
CPC ................. G01D 5/34707; G01D 5/3473
See application file for complete search history.

(56) References Cited

U.S. PATENT DOCUMENTS

| | | | |
|---|---|---|---|
| 3,654,480 A | 4/1972 | Stephenson | |
| 5,332,895 A | 7/1994 | Rieder et al. | |
| 6,043,483 A | 3/2000 | Schreiber | |
| 11,118,994 B2 * | 9/2021 | Tao | G01G 5/006 |
| 11,385,081 B2 * | 7/2022 | Goto | B25J 19/02 |
| 2017/0336226 A1 | 11/2017 | Chen et al. | |

FOREIGN PATENT DOCUMENTS

JP S60-168020 8/1985

* cited by examiner

*Primary Examiner* — Kevin K Pyo
(74) *Attorney, Agent, or Firm* — Mannava & Kang, P.C.

(57) ABSTRACT

A rotation angle encoder apparatus is disclosed. The rotation angle encoder apparatus may comprise a plurality of light sources, a plurality of light detectors, and a plurality of pinions rotatable about a shaft. Each of the pinions may comprises a plurality of teeth and a plurality of gaps. The rotation angle encoder apparatus may comprise a plurality of stacked configurations such that, when the shaft is rotated, transmissivity may be measured to determine or calculate at least one measurement, such as an angle of rotation, position, movement, distance, or other discernable measurement. The rotation angle encoder apparatus with a plurality pinions and associated measurable transmissivities may enable an optical spectrum analyzer to increase wavelength accuracy and improve resolution in optical measurements.

20 Claims, 8 Drawing Sheets

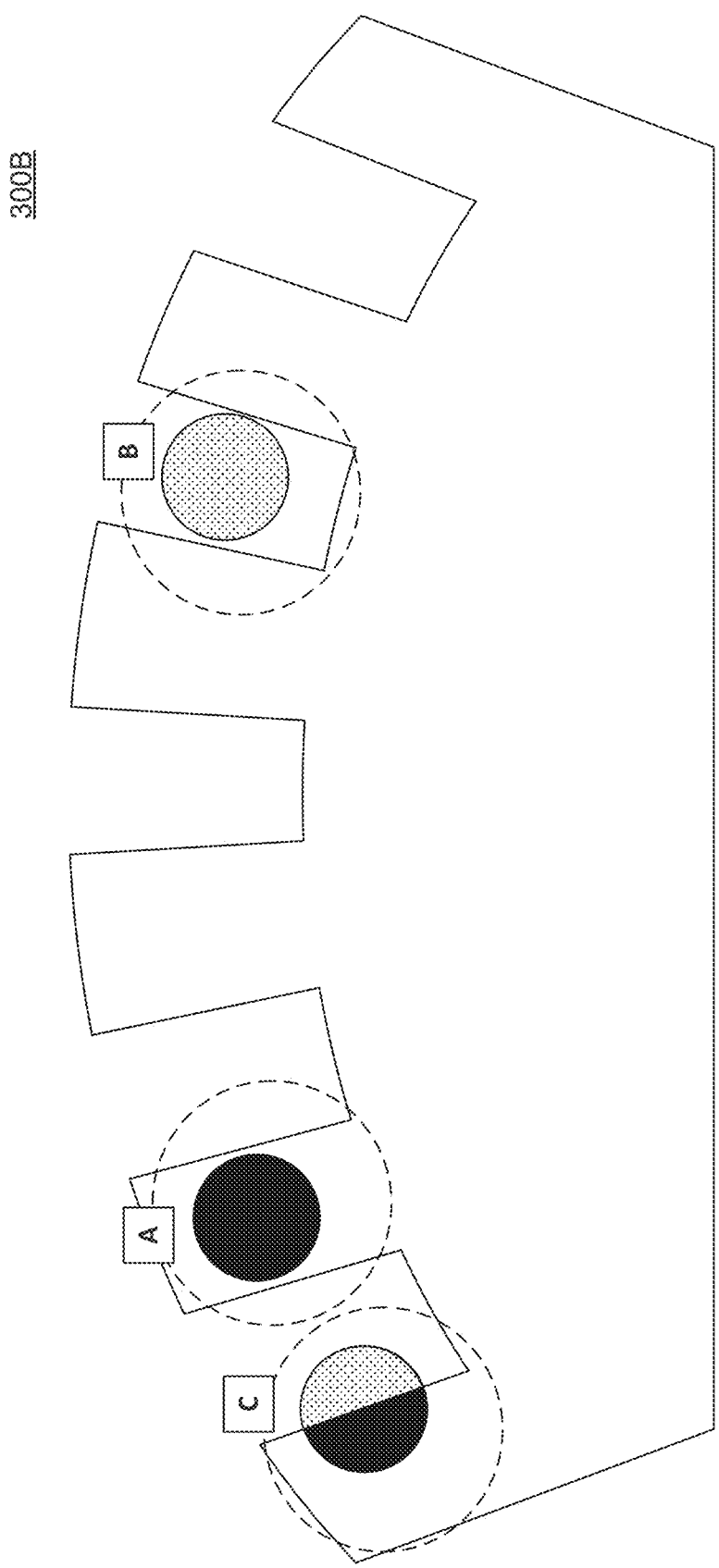

500

Providing a first configuration comprising a first light source, a first light detector to detect a first light bar from the first light source, and a first pinion fixed on a rotatable shaft, the first pinion positioned between the first light source and the first light detector such that the first light bar has a first measurable transmissivity indicative of a measureable distance of angle of the rotatable shaft
501

Providing a second configuration below the first configuration, the second configuration comprising a second light source, a second light detector to detect a second light bar from the second light source, and a second pinion fixed on the rotatable shaft, the second pinion positioned between the second light source and the second light detector such that the second light bar has a second measurable transmissivity that is different from the first measurable transmissivity
502

Providing a third configuration below the second configuration, the third configuration comprising a third light source, a third light detector to detect a third light bar from the third light source, and a third pinion fixed on the rotatable shaft, the third pinion positioned between the third light source and the third light detector such that the third light bar has a third measurable transmissivity that is different from the first and second measurable transmissivities
503

FIG. 5

ROTATION ANGLE ENCODER APPARATUS

PRIORITY

This patent application is a Continuation of commonly assigned and co-pending U.S. patent application Ser. No. 16/243,862, filed Jan. 9, 2019, the disclosure of which is hereby incorporated by reference in its entirety.

TECHNICAL FIELD

This patent application is directed to optical spectrum analysis, and more specifically, to a rotation angle encoder apparatus that utilizes an efficient design and a plurality of light bars to help increase wavelength accuracy and improve resolution in optical measurements in optical spectrum analysis.

BACKGROUND

An encoder is an electromechanical device that is used to measure motion or position. This may be achieved by "reading" a coded pattern that is typically on a rotating disk. Optical encoders are typically used in optical spectrum analyzers (OSAs) to help measure and analyze optical power at various wavelengths. Optical spectrum analyzers are generally equipped with an optical bandpass filter. Wavelength accuracy tends to be higher when accuracy of controlling the center wavelength of the optical bandpass filter is higher. In other words, the more precisely the center wavelength of the optical bandpass filter is controlled, the more certain a particular wavelength can be achieved.

An optical bandpass filter may include a mechanical device, known as a monochromator, that rotates an optical element, to sweep wavelengths. The rotating angle of the diffraction grating (or other optical element) generally corresponds to the wavelength to be measured. In such systems, a motor may drive the diffraction grating and an optical encoder may be used to detect rotating angle and provide feedback control. Precision is monumental in achieving accurate and reliable measurements. Although recent technological developments have led to improvements in detected electrical pulses, there are still several drawbacks and technical problems to conventional encoder apparatuses.

For instance, a traditional encoder apparatus will generally employ a single rotary disk, which requires a significant amount of physical space in the radial direction. Moreover, a traditional encoder apparatus may require components with wider tolerances and improved accuracy, all of which may not be entirely cost effective since custom components may be required. These and other technical problems have an impact on OSA design and resolution quality.

As a result, a rotation angle encoder apparatus that utilizes an efficient minimalist design and a plurality of light bars may be helpful increasing wavelength accuracy and improving resolution of optical measurements in order to overcome shortcomings of conventional technologies.

BRIEF DESCRIPTION OF DRAWINGS

Features of the present disclosure are illustrated by way of example and not limited in the following Figure(s), in which like numerals indicate like elements, in which:

FIG. 3B illustrates a view of teeth of a pinion of a rotation angle encoder with three light bar configurations, according to an example;

FIG. 5 illustrates a flow chart of a method for using a rotation angle encoder apparatus, according to an example.

DETAILED DESCRIPTION

Figure 1A:
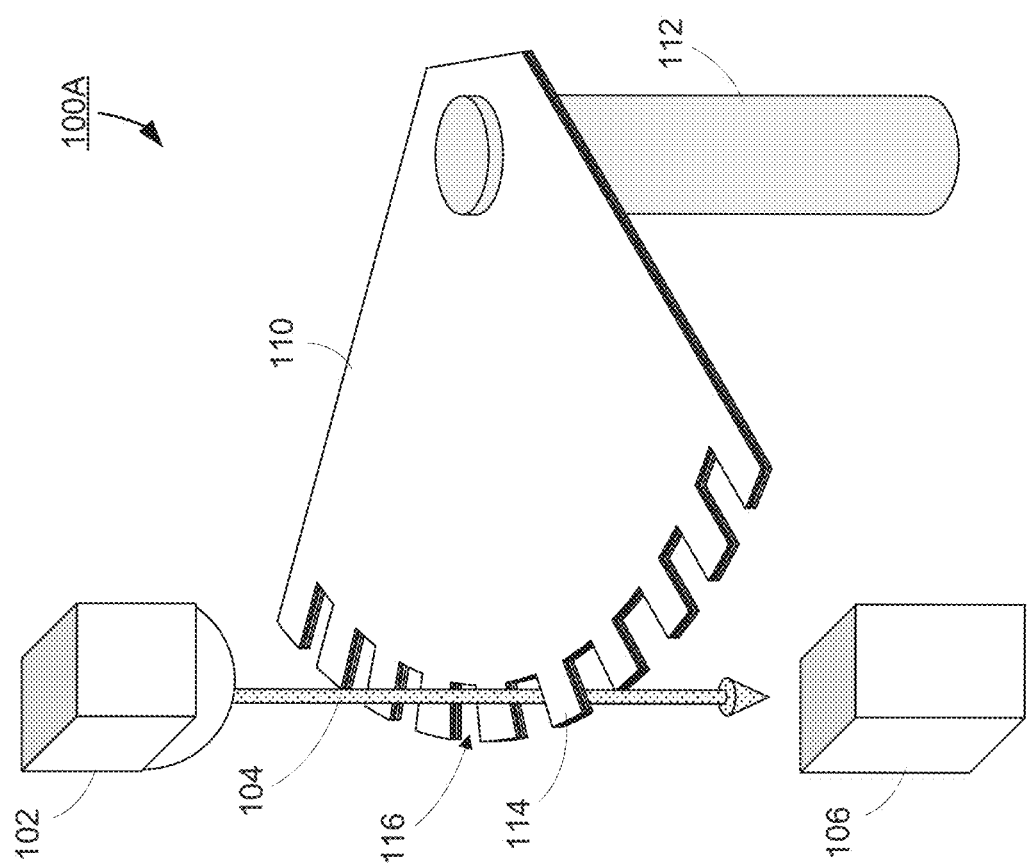
FIG. 1A illustrates a planar view of a rotation angle encoder apparatus with a single pinion configuration, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As described above, an encoder is an electromechanical device that is used to measure motion or position. This may be achieved by "reading" a coded pattern that is typically on a rotating disk. A contact encoder may employ a mechanical contact between a brush or pin sensor and the coded disk, which typically results in physical wear. Non-contact encoders are becoming more popular because they eliminate the mechanical contact found in contact encoders thereby increasing longevity of use. The most common types of non-contact encoders are magnetic, capacitive, and optical.

Optical encoders are typically used in optical spectrum analyzers (OSAs) to help measure and analyze optical power at various wavelengths. In general, a wavelength of light that is inputted into an optical bandpass filter may be restrained to be within a narrow wavelength slot. The light that is passed may then be converted into electrical signals at a photodiode or other similar component. An optical spectrum may then be obtained by plotting electrical signals while sweeping a center wavelength of the optical bandpass filter.

An optical bandpass filter may include a mechanical device, known as a monochromator, that rotates an optical (dispersive) element, to sweep wavelengths. This optical element may be a diffraction grating, but may be also a prism or other reflecting device. Wavelength accuracy may be higher when accuracy of controlling the center wavelength of the optical bandpass filter is higher. In other words, the more precisely the center wavelength of the optical bandpass filter is controlled, the more certain a wavelength can be achieved, which may be critical for high resolution measurements in an OSA.

The monochromator may rotate a chromatic dispersion element, or diffraction grating, to sweep wavelengths. The rotating angle of the diffraction grating (or other optical element) may generally correspond to the wavelength to be measured. In such systems, a motor may drive the diffraction grating and an optical encoder may be used to detect rotating angle and provide feedback control. Recent technological developments have allowed detected electrical pulses to be multiplied by several thousands to precisely control the rotating angle of the diffraction grating with a high resolution, e.g., 0.2 or smaller arc seconds.

That said, a traditional encoder apparatus will generally employ a large and bulky rotary disk. Such a configuration may require significant physical space to accommodate a full-sized 360° rotary component. Furthermore, such an apparatus may also utilize only a single light bar (or light beam), which is not entirely reliable when precision measurements are demanded. Together, use of cumbersome rotary disk and a single light bar may result in various types of encoder errors, such as quantization error, instrument error, cycle interpolation error, or other related errors.

As described herein, a rotation angle encoder apparatus that utilizes a minimalist design having a plurality of light bars is disclosed. The rotation angle encoder apparatus may utilize an efficient minimalist design and a plurality of light bars, all of which may be helpful in increasing wavelength accuracy and improving resolution of optical measurements.

FIG. 1A illustrates a planar view of a rotation angle encoder apparatus 100A with a single pinion and a single light bar, according to an example. As shown, the rotation angle encoder apparatus 100A may include a light source 102 that transmits a light beam or light bar 104 to a light detector 106. A pinion 110 may be fitted on a shaft 112. The pinion 110 may have teeth 114 and gaps 116, such that when the shaft 112 is angularly rotated, the pinion 110 may allow light to pass through via the gaps 116 to the light detector 106, block the light entirely via the teeth 114, or something in between (e.g., partial blockage and partial passage of light).

In an example, the light source 102 may be a light emitting diode (LED). Although an LED may provide several advantages (e.g., cost, operating light, durability, etc.), the light source 102 may be another light source, such as a lamp (e.g., tungsten filament) or other source. The light bar 104 may have a cylindrical shape, such that a cross section of the light bar 104 may be circular or elliptical. It should be appreciated that another shape of the light beam may be possible. In some examples, the shape of the light beam may be rectangular. The light beam may also be guide by a fiber (not shown) to the pinion 110. This may allow a very small aperture and therefore a high angular sensitivity.

In an example, the light detector 106 may be a sensor, such as a photodiode, phototransistor, or light dependent resistor. The sensor may be directly illuminated or the light may be transferred by a fiber to the sensor, as described above, allowing a very small aperture.

The pinion 110 and shaft 112 may be important components in the rotation angle encoder apparatus 100 as well. The pinion 110, for example, may be produced using a variety of substrate material. This may include, without limitation, glass, metal, plastic, or combination thereof. The pinion 110 and shaft 112 may each be molded, formed, shaped, or cut to each designed specification. Each type of material or fabrication technique may possess characteristics beneficial to any particular application or use. For instance, glass may be used where high degrees of accuracy may be required because it can be made relatively flat and has lower thermal expansion properties. However, glass may not be ideal in optical applications because of transparency or issues with reflectivity. That said, various coatings may be used on any of the materials, including glass, for absorbing and/or reflecting light. Metal may be used where durability is most critical and resolution is not as important a factor. Metal may also be used to manufacture more precise or complicated shapes. That said, cost of metal and fabrication of metal (e.g., evaporation, etching, etc.) may generally be higher. Plastic may have similar resolution capabilities as glass but may not be as accurate or as durable as metal.

In some examples, the pinion 110 and the shaft 112 may be distinct components that are fitted together using a variety of techniques. In some examples, the pinion 110 and the shaft 112 may be formed as a single, integrated component. Other various examples or techniques may also be provided.

Conventional disk or rotary encoders may be used to measure rotational motion of a shaft. As the disk rotates, opaque sections of the disk may block light passages and non-opaque sections of the disk may allow light passage. This may help generate square-wave pulses, which can then be measured by a counter and/or other signal conditioning electronics, for example, and be interpreted as position or motion. The rotation angle encoder apparatus 100, as described herein, may achieve a similar result without the excess bulk that comes with a full rotational disk.

Figure 1B:
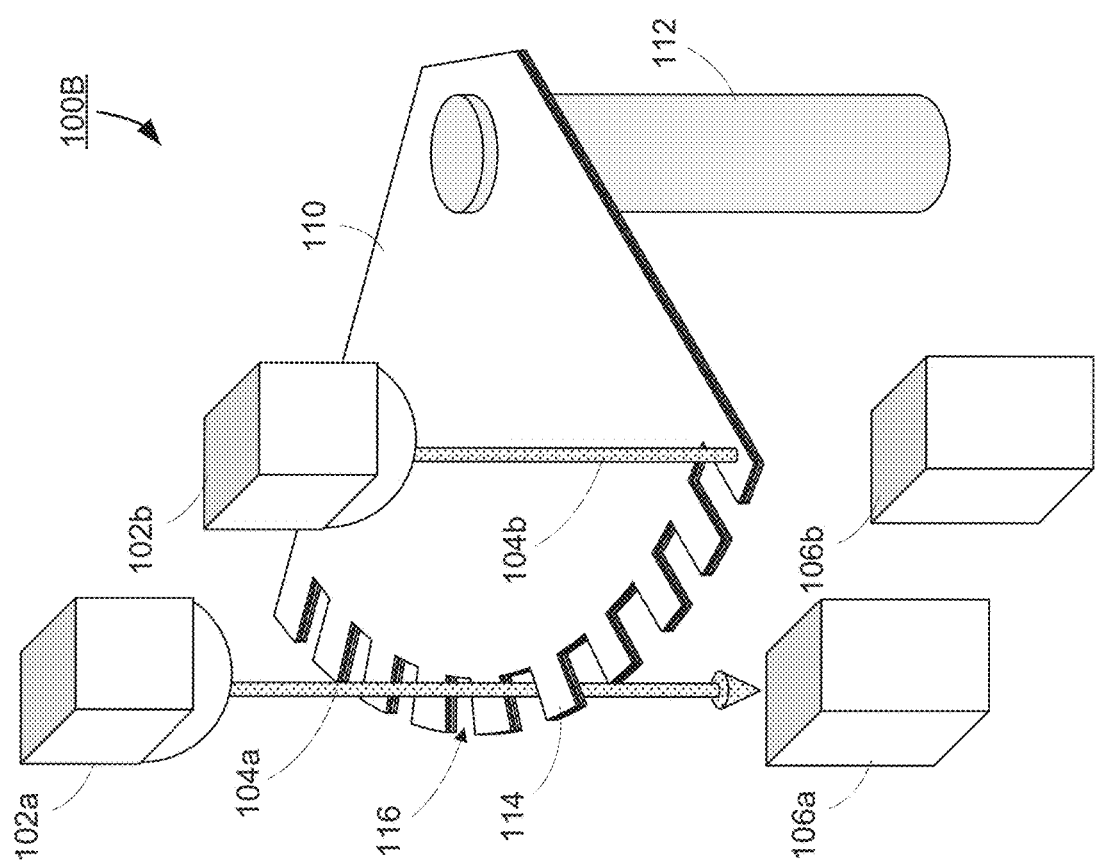
FIG. 1B illustrates a planar view of a rotation angle encoder apparatus with an additional of light bar configuration, according to an example.

FIG. 1B illustrates a planar view of a rotation angle encoder apparatus 100B with an additional of light bar configuration, according to an example. As shown, the rotation angle encoder apparatus 1003 may be similar the rotation angle encoder apparatus 100A, as shown in FIG. 1. For example, the rotation angle encoder apparatus 100B may include a light source 102a that transmits a light beam or light bar 104a to a light detector 106a. A pinion 110 may be fitted on a shaft 112. The pinion 110 may have teeth 114 and gaps 116, such that when the shaft 112 is angularly rotated, the pinion 110 may allow light to pass through via the gaps 116 to the light detector 106, block the light entirely via the teeth 114, or something in between (e.g., partial blockage and partial passage of light), but with a second light source 102b that transmits a light beam or light bar 104b to a light detector 106b.

However, in FIG. 1B, the pinion 110 may include a second (additional) light source 102b that transmits a light beam or light bar 104b to be detected by light detector 106b. As shown, light bar 104a may pass through via the gaps 116 to the light detector 106a while light bar 104b may be blocked via the teeth 114 and remain undetected by light detector 10b.

In some examples, the two light bars may be digitized to produce a digital quadrature signal. In other words, there may be two general states: light passing or light being blocked. However, in such examples, an angular resolution may be limited by a width of element on the disk which blocks or passes the light, in this case a particular tooth 114 or gap 116 of the pinion 110.

For a high resolution, a traditional encoder may use a very large disk with a large number of fine blocking elements. Therefore, a simple digitalization may not be appropriate and optical power passing the light bar may be measured in only in an analog manner. Accordingly, analog electric signal must then be converted to a digital signal using, for example an analog-to-digital converter (ADC). This conversion, then is not just of the two states, but on many more, typically in the range of 1000 states.

Thus, for a continuous operation over a rotation angle, the two light bars may be arranged in a distance that is equal to half the diameter of the beams plus an integer value of teeth of the pinion (0, 1, 2, etc.) and the diameter of the beams may be equal to a width of the teeth 114 element and the shape of the beam, in this case, may be rectangular. Now, for a very high resolution, a very fine beam diameter and very fine pinion teeth may be necessary. Whereas a light bar with a small beam diameter may be a cost-effective and standard component (or a beam diameter may be narrowed using an optical fiber), fabrication of a pinion or a full rotary disk with optical writing of the blocking/passing or reflecting parts may be relative expensive. However, a cost effective solution for medium number of units may only be possible with usage of standard light bar components with wider tolerances of beam diameter and shape, and with limited accuracy in such an assembly position. Thus, using more than two cheap light bars with analog output signals may be advantageous.

For instance, it may not be mechanically difficult or challenging to fabricate pinion with a width of the teeth of 0.3 mm and one light bar. For analog operation may only require a width of the beam of 0.3 mm, two light bars with 0.15 mm each or 3 light bars with 0.1 mm each, or so forth. Thus, in a 3 light bar configuration, power within in one light bar may change from 0 to 100% when moving the tooth ⅓ of the tooth width. This movement may then be transferred by an electric ADC to 1000 steps, each having 0.1 µm. It should be appreciated that other various examples or configurations may also be provided.

It should be appreciated that while FIG. 1B is includes two light bars, there may be other configurations and variations with N number of light bars that are used. As described in more detail herein, additional light bars may allow for more wavelength control and more precise optical measurements. Although depicted as a single pinion 110 and a single shaft 112, it should also be appreciated that any number or combinations of pinions and/or shafts may be provided. Examples described herein will provide more detailed explanations.

Figure 2:
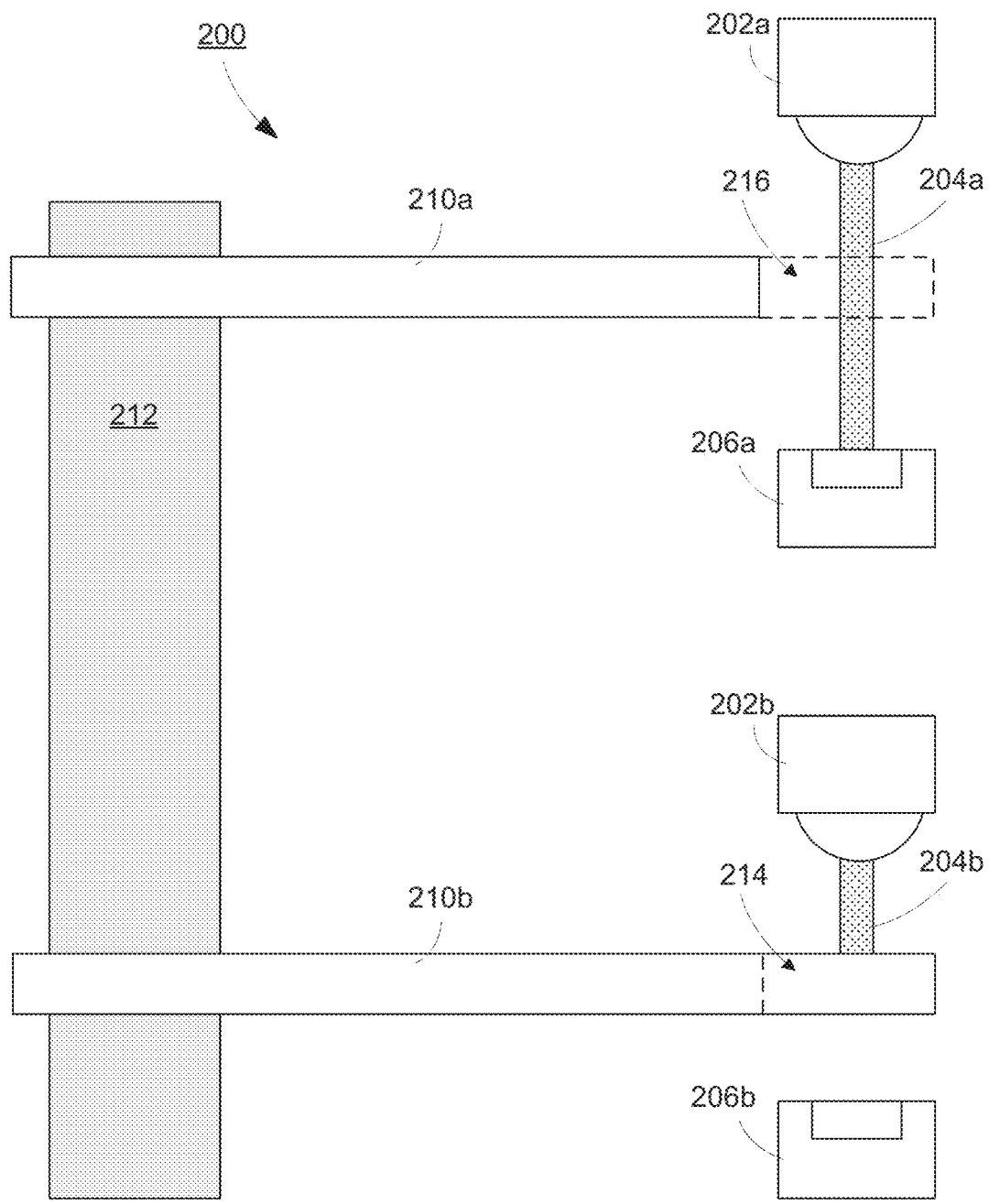
FIG. 2 illustrates a side view of a rotation angle encoder apparatus with a stacked configuration, according to an example.

FIG. 2 illustrates a side view of a rotation angle encoder apparatus 200 with a stacked configuration, according to an example. As shown, the rotation angle encoder apparatus 200 may be similar to having two rotation angle encoder apparatuses (as shown in FIG. 1) with one stacked upon the other. The rotation angle encoder apparatus 200 may have a first portion having a first light source 202a that transmits a light beam or light bar 204a to a light detector 206a. The first portion also includes a first pinion 210a be fitted on a shaft 212. The rotation angle encoder apparatus 200 may have a second portion situated below the first portion, the second portion having a second light source 202b that transmits a light beam or light bar 204b to a light detector 206b. The second portion also includes a second pinion 210b be fitted on a shaft 212.

The first pinion 210a and second pinion 210b may each have teeth and gaps (similar to pinion 110 in FIG. 1), such that when the shaft 112 is angularly rotated, the first and second pinions 210a, 210b may allow light to pass through via the gaps 116 to the light detector 106, block the light entirely via the teeth 114, or something in between (e.g., partial blockage and partial passage of light). In the stacked configuration as shown, the first pinion 210a may be positioned in such a way that when light bar 204a passes through gap 216 of the first pinion 210a, light bar 205b may get blocked by a tooth 214 of the second pinion 210b. Again, additional light bars and pinions may allow for more wavelength control and more precise optical measurements. Other various configurations may also be provided. It should be appreciated that in a reflective design, light may be either reflected to the light detector 206a and 206b by a tooth 214 or absorbed or guided to another place or location. It should also be appreciated that in some examples, the pinion 210a and 210b may be replaced by a disk with holes, or other similar component. In some examples, the pinion may be a disk made of glass or metal with elements for passing, reflection, deviation or absorbing the light, as described herein.

As described herein, there may be two or more light bars on one pinion and one or more on another pinon. Several light bars could also be radially arranged. These and other various configurations and arrangements may be provided. What is important in an efficient design is that every angle (or most angles) of at least one of the light bars may partly transmit light to the sensor.

Figure 3A:
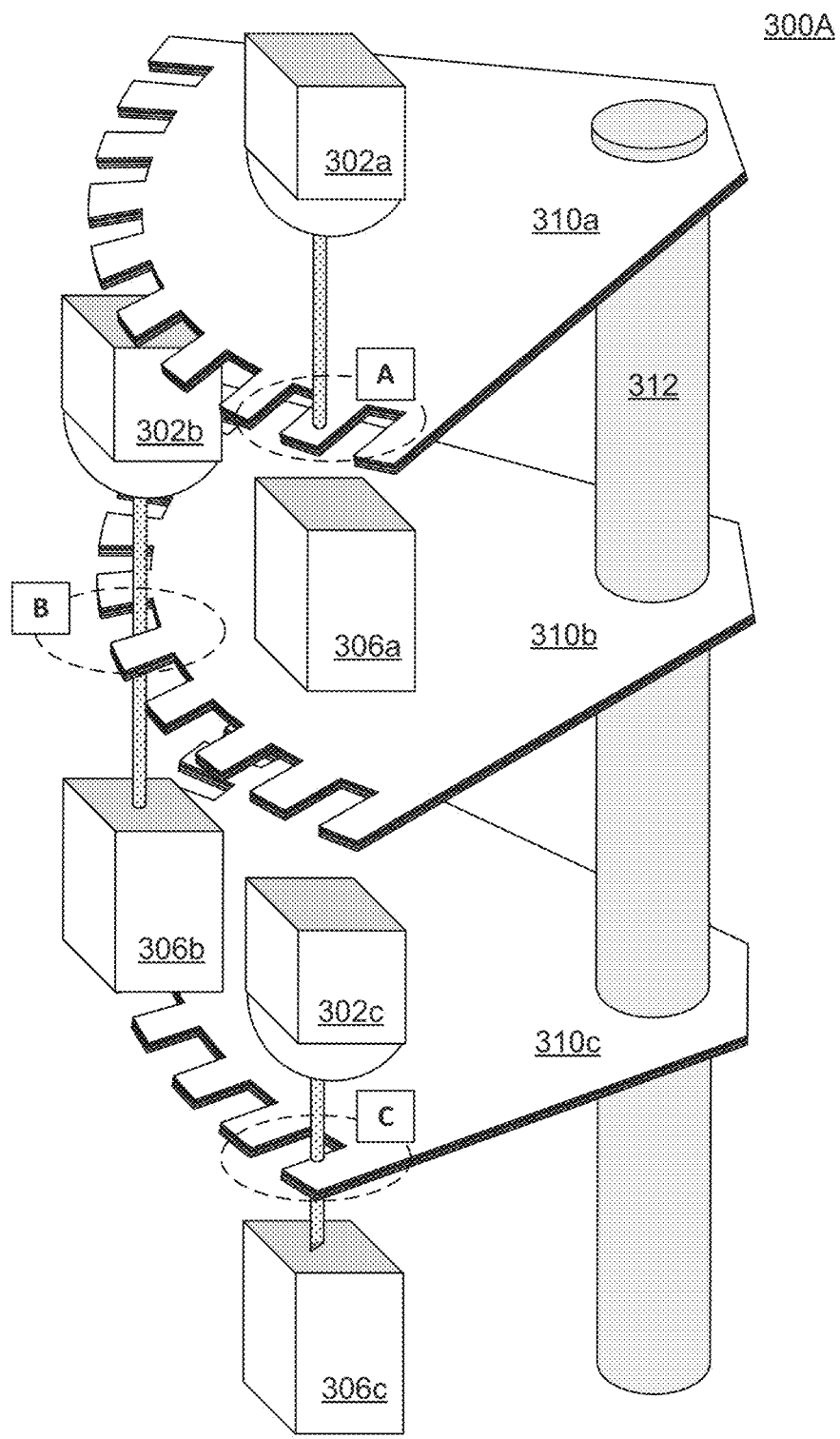
FIG. 3A illustrates a planar view of a rotation angle encoder apparatus with a stacked configuration, according to an example.

FIG. 3A illustrates a planar view of a rotation angle encoder apparatus 300A with a stacked configuration, according to an example. As shown, the rotation angle encoder apparatus 300A may be similar to having three rotation angle encoder apparatuses (as shown in FIG. 1) stacked upon the each other. The rotation angle encoder apparatus 300A may have a first portion having a first light source 302a that transmits a first light beam or light bar 304a to a first light detector 306a. The first portion may also include a first pinion 310a fitted on a shaft 312. The rotation angle encoder apparatus 300A may have a second portion situated below the first portion, the second portion having a second light source 302b that transmits a second light beam or light bar 304b to a second light detector 306b. The second portion may also include a second pinion 310b fitted on the shaft 312. The rotation angle encoder apparatus 300A may have a third portion situated below the first and second portions, the third portion having a third light source 302c that transmits a third light beam or light bar 304c to a third light detector 306c. The third portion may also include a third pinion 310c fitted on the shaft 312.

In the stacked configuration as shown in FIG. 3A, the first pinion 310a, the second pinion 310b, and the third pinion 310c may be positioned in such a way that light is blocked (A) by a tooth of the first pinion 310a, light completely passes (B) through a gap in the second pinion 310b, and light partially passes through a portion of a gap of the third pinion 310c and is partially blocked (C) by a tooth of the third pinion 310c.

FIG. 3B illustrates a view 300B of teeth of an exemplary pinion of the rotation angle encoder apparatus 300A with three light bar configurations (A), (B), and (C), according to an example. As shown, the exemplary pinion 310 may depict circular cross-sectional views of light beams that are entirely blocked (A) by a tooth, entirely passes (B) a gap, and partially blocked/partially passes (C). Other various configurations may also be provided. Measuring the differing and various passage/blockage of light by the one or more pinions using a plurality of light bars may allow for more wavelength control and more precise optical measurements.

Figure 4A:
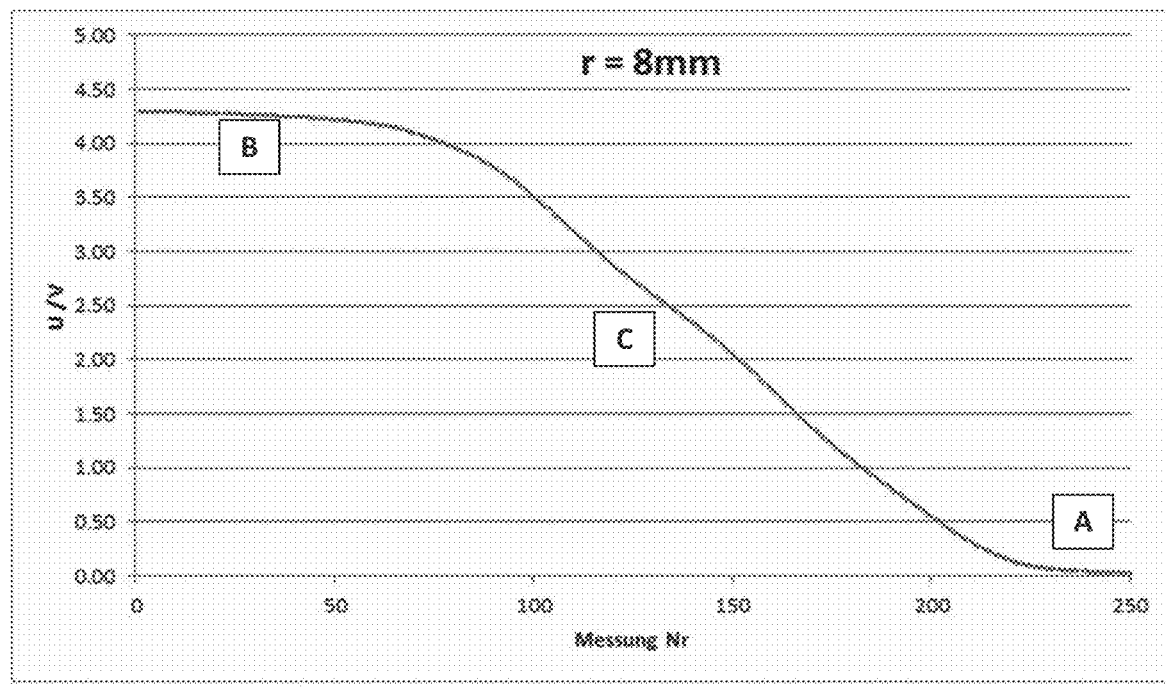
FIG. 4A illustrates a graph of a signal for a single light bar over a rotation angle of a rotation angle encoder apparatus, according to an example.

FIG. 4A illustrates a graph 400A of a signal for a single light bar over a rotation angle of a rotation angle encoder apparatus, according to an example. The measurement in graph 400A, as shown, depicts a single light bar (U/V) over a rotation angle. Initially (at "0"), a measured signal shows that there is no tooth of the pinion in the path of the light beam and therefore light passes entirely through the pinion, resulting in approximately 4.35 U/V (or other light-measuring unit). This may be similar to light bar configuration (B) of FIG. 3. At 70 measurement units, a tooth of the pinion may begin to block the light bar. This may continue until approximately the 220$^{th}$ measurement unit. Thus, in between 70 and 220 measurement units, this may be similar to light bar configuration (C) of FIG. 3. At 220 and on, the light beam may be entirely totally blocked by the tooth, similar to light bar configuration (A) of FIG. 3. It should be appreciated that depending on distance of the light beam from the rotation axis (here, for example, 8 mm) a useful range 70-220 may be a large or a very small angle. In an example, a width of the teeth must fit to a covered angle and wavelength accuracy.

Figure 4B:
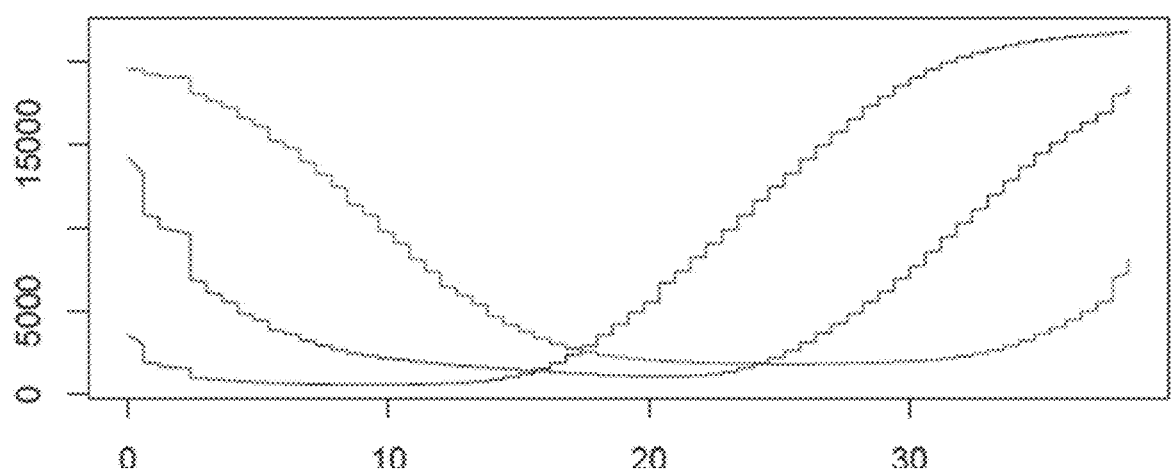
FIG. 4B illustrates a graph of signals for three light bars for higher resolution angle determination in a rotation angle encoder apparatus, according to an example.

FIG. 4B illustrates a graph 400B of signals for three light bars for higher resolution angle determination in a rotation angle encoder apparatus, according to an example. As shown, there may be three lines depicted that represent each light bar along a rotational angle pathway (e.g., three pinions on a single shaft in a stacked configuration similar to FIG. 3). Combining several bars in a stacked configuration, each portion of the rotation angle encoder apparatus may sense a small angle change. As shown, there may be at least one of them which changes the output voltage when the angle changes. Thus, the graph 400B may depict measurements of a three light bars, which do not necessarily have to be perfectly adjusted or aligned. For a coarse determination of angle, a number of peaks of one of the curves from a known angle may be counted or measured. In this way, using a stacked configuration not only saves physical space (if needed) but provides a larger number of measurements.

In a monochromator and/or an optical spectrum analyzer, it may be critical to know a precise angle of an optical grating. Using the rotation angle encoder apparatus, as described herein, a more exact angle and therefore central wavelength may be expected and provided for spectral analysis, all of which may result in improved accuracy and efficiency.

While examples described herein are directed to single, double, and triple stacked configurations, it should be appreciated that any number of configurations may be provided. For example, the rotation angle encoder apparatuses shown in FIGS. 1-3 may include any number of light bars and/or any number (or layout) of light sensing regions in any design or layout beyond what is described herein. These variations may provide greater efficiency in design and improve wavelength accuracy in optical spectrum analyzers and/or other optical measurement devices that use encoders. Furthermore, having a plurality of light bar sensing regions in a stacked configuration may result in high resolution capabilities not found in traditional encoder apparatuses.

FIG. 5 illustrates a flow chart of a method for providing a rotation angle encoder apparatus, according to an example. The method 500 is provided by way of example, as there may be a variety of ways to carry out the method described herein. Although the method 500 is primarily described as being performed by rotation angle encoder apparatus 100, 200, and/or 300 as depicted in FIGS. 1-3, the method 500 may be executed or otherwise performed by one or more processing components of the rotation angle encoder apparatus 100, 200, and/or 300, or by another system or a combination of systems. Each block shown in FIG. 5 may further represent one or more processes, methods, or subroutines, and one or more of the blocks may include machine readable instructions stored on a non-transitory computer readable medium and executed by a processor or other type of processing circuit to perform one or more operations described herein.

At block 501, a first configuration of a rotation angle encoder apparatus may be provided. In an example, the first configuration may include a first light source that generates a first light bar. The first configuration may also include a first light detector to detect the first light bar from the first light source. The first configuration may also include a first pinion fixed on a rotatable shaft.

The first light source may be at least one of an LED or lamp. The first light detector may be a silicon-type photosensor or other similar sensor. The first pinion may include a plurality of teeth and a plurality of gaps. It should be appreciated that the first pinion may be positioned between the first light source and the first light detector such that the first light bar has a first measurable transmissivity indicative of a measurable distance or angle of the rotatable shaft.

At block 502, a second configuration of a rotation angle encoder apparatus may be provided. In an example, the second configuration may include a second light source that generates a second light bar. The second configuration may also include a second light detector to detect the second light bar from the second light source. The second configuration may also include a second pinion fixed on a rotatable shaft.

The second light source may be at least one of an LED or lamp. The second light detector may be a silicon-type photosensor or other similar sensor. The second pinion may include a plurality of teeth and a plurality of gaps. It should be appreciated that the second pinion may be positioned between the second light source and the second light detector such that the second light bar has a second measurable transmissivity. In some examples, the second measurable transmissivity may be different than the first measurable transmissivity.

At block 503, a third configuration of a rotation angle encoder apparatus may be provided. In an example, the third configuration may include a third light source that generates a first light bar. The third configuration may also include a third light detector to detect the third light bar from the third light source. The third configuration may also include a third pinion fixed on a rotatable shaft.

The third light source may be at least one of an LED or lamp. The third light detector may be a silicon-type photosensor or other similar sensor. The third pinion may include a plurality of teeth and a plurality of gaps. It should be appreciated that the third pinion may be positioned between the third light source and the third light detector such that the third light bar has a third measurable transmissivity. In some examples, the third measurable transmissivity may be different than the first measurable transmissivity and the second measurable transmissivity.

The components and functionalities of the method 500 may be the same, similar, or different as those described above. Furthermore, it should be appreciated that transmissivity may be measured at each of the configurations based on whether the light bar is being blocked by at least one of the plurality of teeth, passes through at least one of the plurality of gaps, or a combination thereof.

Figure 6:
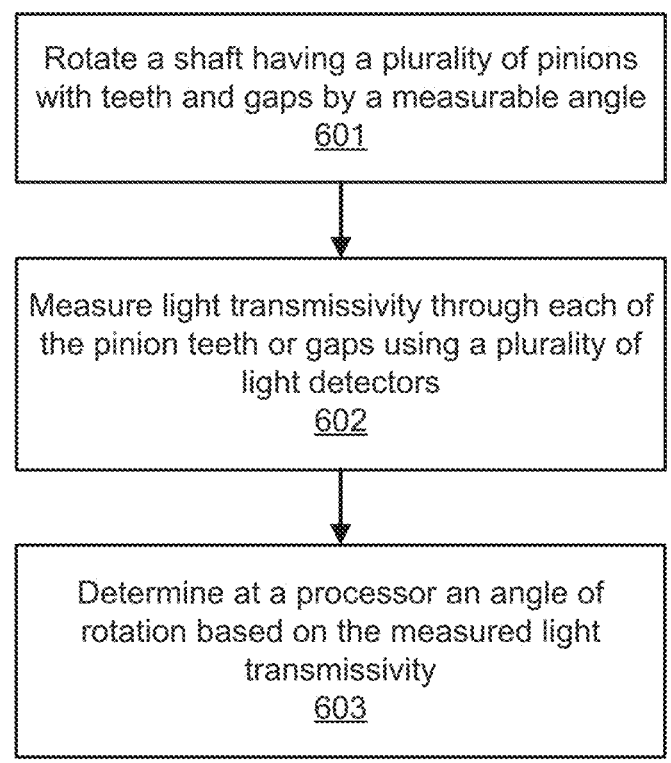
FIG. 6 illustrates a flow chart of a method for making a rotation angle encoder apparatus, according to an example.

FIG. 6 illustrates a flow chart of a method for using a rotation angle encoder apparatus, according to an example. The method 600 is provided by way of example, as there may be a variety of ways to carry out the method described herein. Although the method 600 is primarily described as being performed by rotation angle encoder apparatus 100, 200, and/or 300 as depicted in at least FIGS. 1-3, the method 600 may be executed or otherwise performed by one or more processing components of the rotation angle encoder apparatus 100, 200, and/or 300, or by another system or a combination of systems. Each block shown in FIG. 6 may further represent one or more processes, methods, or subroutines, and one or more of the blocks may include machine readable instructions stored on a non-transitory computer readable medium and executed by a processor or other type of processing circuit to perform one or more operations described herein.

At block 601, a shaft of a rotation angle encoder apparatus may be rotated by a measurable angle. This rotation may be achieved manually or by a motor. The shaft may include a plurality of pinions fixed along a length of the shaft. Also, each of the plurality of pinions may include a plurality of teeth and a plurality of gaps.

At block 602, light transmissivity may be measured. For example, light transmissivity may be measured through each of the plurality of pinions using a plurality of light detectors. It should be appreciated that each of the plurality of light detectors may correspond and align with at least one light source. The rotation angle encoder apparatus may include a variety of design and layout configurations for the plurality of light sources, light detectors, and pinions to maximize efficiency and increase measurement data.

In some examples, the light source may include at least one of a light emitting diode (LED) and a lamp. In some examples, the plurality of light detectors may be silicon-type photosensors. Each of the light detectors may also be communicatively coupled to a processor at an optical spectrum analyzer or other measurement device or system.

At block 603, the processor communicatively coupled to the plurality of light detectors may determine an angle of rotation, among other measurements, based on the measured light transmissivity across the plurality of light detectors. It should be appreciated that the measured light transmissivity may be lowest when light is fully blocked by at least one of the plurality of teeth, and the measured light transmissivity may be highest when light fully passes through at least one of the plurality of gaps. As described herein, when using a plurality of light sources, light detectors, pinions, all in various configurations.

It should also be appreciated that the rotation angle encoder apparatus 100, 200, and 300 may also include or communicate with other components not shown. For example, these may include external processors, counters, analyzers, and other measuring devices or systems. This may also include middleware (not shown) may be included as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back-end to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the rotation angle encoder apparatus 100, 200, and 300, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the rotation angle encoder apparatus 100, 200, and 300 and/or run one or more application that utilize data from the rotation angle encoder apparatus 100, 200, and 300 or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to optical spectrum analysis in OSAs, it should be appreciated that that the rotation angle encoder apparatuses may also be used in other various systems, such as printers, photocopiers, automotive or aerospace telemetry systems, and optical devices, such as mice, trackballs, etc. In additional, the rotation angle encoder apparatuses and methods described herein may also be used to provide, directly or indirectly, measurements for distance, angle, rotation, speed, position, wavelength, transmissivity, and other related measurements. Furthermore, while examples are directed to rotation angle encoders, it should appreciated that linear or other encoder configurations may also be provided. Ultimately, the systems and methods described herein may minimize bulkiness, increase accuracy and reliability, and costs.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A rotation angle encoder apparatus, comprising:
a first pinion fixed on a rotatable shaft, wherein:
the first pinion, having a non-disk shape, comprises a plurality of teeth and a plurality of gaps; and
the first pinion is positioned between a first light source and a first light detector such that a first light bar generated by the first light source has a first measurable transmissivity indicative of a measureable distance or angle of the rotatable shaft; and
a second pinion fixed on the rotatable shaft, wherein:
the second pinion comprises a plurality of teeth and a plurality of gaps; and
the second pinion is positioned between a second light source and a second light detector such that a second light bar generated by the second light source has a second measurable transmissivity, wherein the second measurable transmissivity is different than the first measurable transmissivity at the measurable distance or angle of the rotatable shaft, and
wherein the first light source and the second light source are positioned such that when the first light bar generated by the first light source entirely passes through one of the plurality of gaps of the first pinion, the second light bar generated by the second light source is entirely blocked by one of the plurality of teeth of the second pinion.

2. The rotation angle encoder apparatus of claim 1, wherein the second pinion is positioned below the first pinion.

3. The rotation angle encoder apparatus of claim 1, wherein the first measurable transmissivity comprises the first light bar being blocked by at least one of the plurality of teeth of the first pinion, passing through at least one of the plurality of gaps of the first pinion, or a combination thereof, and wherein the second measurable transmissivity comprises the second light bar being blocked by at least one of the plurality of teeth of the second pinion, passing through at least one of the plurality of gaps of the second pinion, or a combination thereof.

4. The rotation angle encoder apparatus of claim 1, wherein the first light source comprises at least one of a light emitting diode (LED) and a lamp, and the second light source comprises at least one of a light emitting diode (LED) and a lamp.

5. The rotation angle encoder apparatus of claim 1, wherein each of the first light detector and the second light detector comprises a photodiode comprising at least one of silicon (Si), germanium (Ge), indium gallium arsenide (InGaAs), gallium phosphide (GaP).

6. The rotation angle encoder apparatus of claim 1, wherein the first light detector and the second light detector are communicatively coupled to a processor of an optical spectrum analyzer.

7. The rotation angle encoder apparatus of claim 1, further comprising:
a third pinion fixed on the rotatable shaft, wherein:
the third pinion comprises a plurality of teeth and a plurality of gaps; and
the third pinion is positioned between a third light source and a third light detector such that a third light bar generated by the third light source has a third measurable transmissivity.

8. The rotation angle encoder apparatus of claim 7, wherein the third pinion is positioned below the second pinion.

9. The rotation angle encoder apparatus of claim 7, wherein the third measurable transmissivity is different than the first measurable transmissivity and the second measurable transmissivity at the measurable distance or angle of the rotatable shaft.

10. The rotation angle encoder apparatus of claim 7, wherein the third light source is positioned with respect to the third pinion such that when the first light bar entirely passes through one of the plurality of gaps of the first pinion and the second light bar is entirely blocked by one of the plurality of teeth of the second pinion, the third light bar generated by the third light source is partially blocked by one of the plurality of teeth of the third pinion.

11. A non-transitory computer-readable storage medium storing instructions, which when executed by a processor cause the processor to:
provide, in a rotation angle encoder apparatus, a first pinion fixed on a rotatable shaft, wherein:
the first pinion, having a non-disk shape, comprises a plurality of teeth and a plurality of gaps; and
the first pinion is positioned between a first light source and a first light detector such that a first light bar generated by the first light source has a first measurable transmissivity, indicative of a measurable distance or angle of the rotatable shaft; and provide, in the rotation angle encoder apparatus, a second pinion fixed on the rotatable shaft, wherein:
the second pinion comprises a plurality of teeth and a plurality of gaps; and
the second pinion is positioned between a second light source and a second light detector such that a second light bar generated by the second light source has a second measurable transmissivity, wherein the second measurable transmissivity is different than the first measurable transmissivity at the measurable distance or angle of the rotatable shaft, and
wherein the first light source and the second light source are positioned such that when the first light bar generated by the first light source entirely passes through one of the plurality of gaps of the first pinion, the second light bar generated by the second light source is entirely blocked by one of the plurality of teeth of the second pinion.

12. The non-transitory computer-readable storage medium of claim 11, wherein the instructions further cause the processor to:
provide a third pinion fixed on the rotatable shaft, wherein:
the third pinion comprises a plurality of teeth and a plurality of gaps; and
the third pinion is positioned between a third light source and a third light detector such that a third light bar generated by the third light source has a third measurable transmissivity.

13. The non-transitory computer-readable storage medium of claim 12, wherein the second pinion is positioned below the first pinion, and the third pinion is positioned below the second pinion.

14. The non-transitory computer-readable storage medium of claim 12, wherein the third measurable transmissivity is different than the first measurable transmissivity and the second measurable transmissivity.

15. The non-transitory computer-readable storage medium of claim 12, wherein the third light source is positioned with respect to the third pinion such that when the first light bar entirely passes through one of the plurality of gaps of the first pinion and the second light bar is entirely blocked b one of the plurality of teeth of the second pinion, the third light bar generated by the third light source is partially blocked by one of the plurality of teeth of the third pinion.

16. The non-transitory computer-readable storage medium of claim 11, wherein the first light source comprises at least one of a light emitting diode (LED) and a lamp, and the second light source comprises at least one of a light emitting diode (LED) and a lamp, and wherein the first light detector and the second light detector comprise a photodiode comprising at least one silicon (Si), germanium (Ge), indium gallium arsenide (InGaAs), gallium phosphide (GaP).

17. A non-transitory computer-readable storage medium storing instructions, which when executed by a processor cause the processor to:
rotate a shaft of a rotation angle encoder apparatus by a measurable angle, wherein:
the shaft comprises first and second pinions fixed along a length of the shaft; and
each of the first and second pinions comprises a plurality of teeth and a plurality of gaps and has a non-disk shape;

position the first pinion between a first light source and a first light detector such that a first light bar generated by the first light source is detected by the first light detector;

position the second pinion between a second light source and a second light detector such that a second light bar generated by the second light source is detected by the second light detector, wherein the first light source and the second light source are positioned such that when the first light bar generated by the first light source entirely passes through one of the plurality of gaps of the first pinion, the second light bar generated by the second light source is entire blocked by one of the plurality of teeth of the second pinion;

measure light transmissivity through each of the first and second pinions using the first and second light detectors; and determine an angle of rotation of the shaft based on the measured light transmissivity across the first and second light detectors.

18. The non-transitory computer-readable storage medium of claim 17, wherein the instructions further cause the processor to:

attach a third pinion along the length of the shaft; and position the third pinion between a third light source and a third light detector such that a third light bar generated by the third light source is detected by the third light detector, wherein the third light source is positioned with respect to the third pinion such that when the first light bar entirely passes through one of the plurality of gaps of the first pinion and the second light bar is entirely blocked by one of the plurality of teeth of the second pinion, the third light bar generated by the third light source is partially blocked by one of the plurality of teeth of the third pinion.

19. The non-transitory computer-readable storage medium of claim 17, wherein each of the first and second light sources comprises at least one of a light emitting diode (LED) and a lamp, wherein the first and second light detectors comprises photodiodes comprising at least one of silicon (Si), germanium (Ge), indium gallium arsenide (InGaAs), gallium phosphide (GaP), and wherein the processor is a processor of an optical spectrum analyzer.

20. The non-transitory computer-readable storage medium of claim 18, wherein the second pinion is positioned below the first pinion, and the third pinion is positioned below the second pinion.

* * * * *